United States Patent
Lee et al.

(10) Patent No.: US 9,419,594 B2
(45) Date of Patent: *Aug. 16, 2016

(54) CLOCK DATA RECOVERY SYSTEM

(75) Inventors: Hae-Chang Lee, Los Altos, CA (US); Andrew Keith Joy, Northampton (GB); Arnold Robert Feldman, San Francisco, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 184 days.

This patent is subject to a terminal disclaimer.

(21) Appl. No.: 13/358,628

(22) Filed: Jan. 26, 2012

(65) Prior Publication Data

US 2012/0192023 A1  Jul. 26, 2012

Related U.S. Application Data

(60) Provisional application No. 61/436,440, filed on Jan. 26, 2011.

(51) Int. Cl.
| | |
|---|---|
| *H04L 7/00* | (2006.01) |
| *H04L 25/00* | (2006.01) |
| *H04L 25/40* | (2006.01) |
| *H03K 3/356* | (2006.01) |
| *H04L 25/03* | (2006.01) |

(52) U.S. Cl.
CPC .... *H03K 3/356173* (2013.01); *H04L 25/03057* (2013.01); *H04L 7/0054* (2013.01); *H04L 7/0087* (2013.01)

(58) Field of Classification Search
None
See application file for complete search history.

(56) References Cited

U.S. PATENT DOCUMENTS

| | | | | |
|---|---|---|---|---|
| 5,483,552 A | * | 1/1996 | Shimazaki et al. | 375/233 |
| 5,548,570 A | * | 8/1996 | Hirajima | G11B 20/10212 |
| | | | | 369/124.13 |
| 5,710,750 A | * | 1/1998 | Tachibana | G11B 20/10203 |
| | | | | 369/124.14 |
| 6,900,676 B1 | * | 5/2005 | Tamura | 327/156 |
| 2005/0201491 A1 | * | 9/2005 | Wei | 375/326 |
| 2008/0111633 A1 | * | 5/2008 | Cranford et al. | 331/10 |
| 2010/0026267 A1 | * | 2/2010 | Easwaran | H02M 3/158 |
| | | | | 323/288 |

* cited by examiner

*Primary Examiner* — Shuwang Liu
*Assistant Examiner* — Gina McKie
(74) *Attorney, Agent, or Firm* — John R. Pessetto; Frank D. Cimino

(57) ABSTRACT

A clock data recovery system is described. It includes a high pass filter for transmitting a filtered data signal in response to receiving an input data signal; an adder for summing the filtered data signal with a feedback signal, wherein the adder produces a summed input signal; a plurality of clocked data comparators for receiving the summed input signal, wherein the clocked data comparators determine an input data bit value; a plurality of clocked error comparators for receiving an error signal associated with clock recovery and DFE tap adaption; an equalization and adaptation logic for selecting an error sample such that a phase associated with the error sample is locked at $h_0=h_1+h_2$; and a phase mixer for transmitting a delay in response to receiving the phase and the delay is transmitted to the clocked-data comparators and the clocked-error comparators.

5 Claims, 4 Drawing Sheets

CLOCK DATA RECOVERY SYSTEM

CROSS REFERENCE TO RELATED APPLICATION(S)

The present application claims priority to jointly owned U.S. Provisional Application corresponding to application No. 61/436,440 entitled "Clock Data Recovery System." This provisional application was filed on Jan. 26, 2011.

DESCRIPTION OF RELATED ART

With the evolution of electronic devices, there is a continual demand for enhanced speed, capacity and efficiency in various areas including electronics, communications, and machinery. This is particularly true with the growing focus on efficiency in data exchanges. Consequently, there remain unmet needs relating to efficient data exchanges.

BRIEF DESCRIPTION OF THE DRAWINGS

The clock data recovery system may be better understood with reference to the following figures. The components within the figures are not necessarily to scale, emphasis instead being placed upon clearly illustrating the principles of the invention. Moreover, in the figures, like reference numerals designate corresponding parts or blocks throughout the different views.

Figure 1:
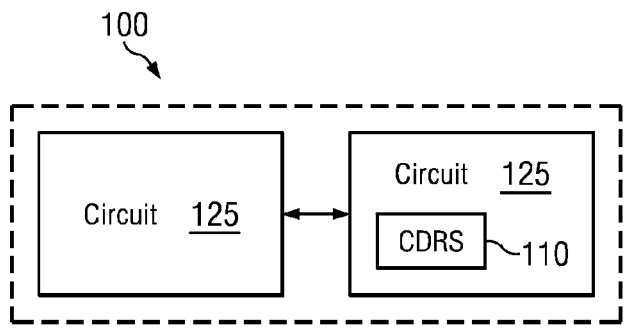
FIG. 1 is an illustrative environmental drawing illustrating an innovative clock data recovery system (CDRS).

While the clock data recovery system is susceptible to various modifications and alternative forms, specific embodiments have been shown by way of example in the drawings and subsequently are described in detail. It should be understood, however, that the description herein of specific embodiments is not intended to limit the clock data recovery system to the particular forms disclosed. In contrast, the intention is to cover all modifications, equivalents, and alternatives falling within the spirit and scope of the clock data recovery system as defined by this document.

DETAILED DESCRIPTION OF EMBODIMENTS

As used in the specification and the appended claim(s), the singular forms "a," "an" and "the" include plural referents unless the context clearly dictates otherwise. Similarly, "optional" or "optionally" means that the subsequently described event or circumstance may or may not occur, and that the description includes instances where the event or circumstance occurs and instances where it does not.

FIG. 1 is an illustrative environmental drawing 100 illustrating an innovative clock data recovery system (CDRS) 110. In this implementation, CDRS 110 may facilitate the exchange of data among circuits, such as circuit 120 and circuit 125. For example, the CDRS 110 may be in high speed serial links between chips used with computer servers, data switches, Internet services or the link. These serial links may have data transfer rates on the order of approximately 17 Gbps. At a high level, the CDRS 110 performs 2-tap partial response equalization with baud rate clock recovery. The associated receiver has a 2-tap partial response decision feedback equalization (DFE). And, the CDRS 110 has adaptation of the clock data recover phase that locks at $h_0 = h_1 + h_2$. The associated receiver may also have a 1-tap partial response decision feedback equalization (DFE) or a full response DFE.

Figure 2:
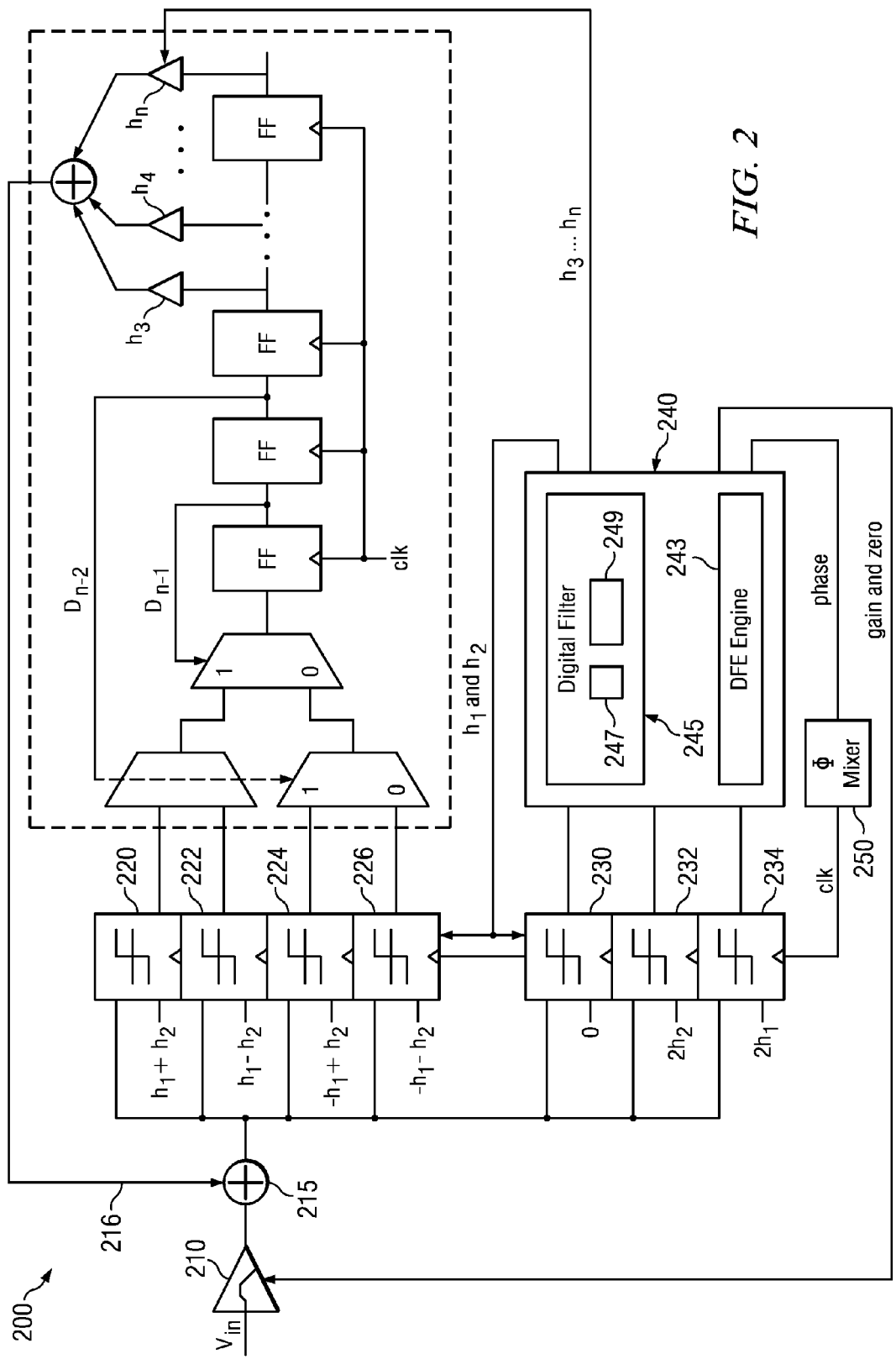
FIG. 2 is an enlarged block diagram of the CDRS of FIG. 1.

FIG. 2 is an enlarged block diagram 200 of the CDRS 110. A high-pass filter 210 filters an input data signal, such as the signal illustrated by $V_{in}$. An adder 215 may sum the filtered data signal with a feedback signal applied along the connection 216. In this implementation, there are four clocked-data comparators 220-228 and three clocked-error comparators 230-234. The data comparators may be used in recovering data, while the error comparators may be used in observing the error in the CDR alignment, the DFE tap adaption and the error sampler slicing levels.

Figure 3A:
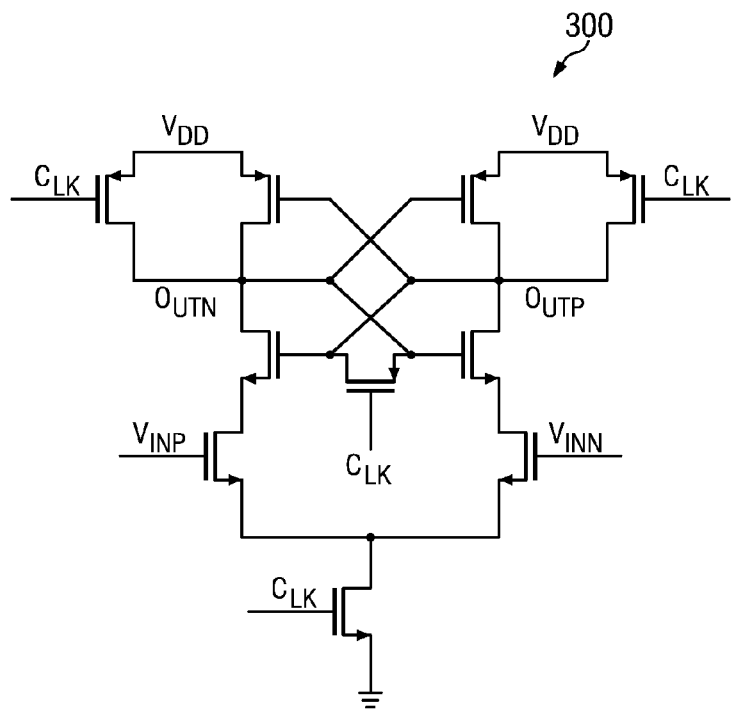
FIG. 3A is a circuit diagram of an illustrative comparator of FIG. 2.

The clocked-comparators, or slicers, may be any one of many kinds of clock comparators. FIG. 3A is a circuit diagram 300 of an illustrative comparator. Returning to FIG. 2, the clocked-data comparators may have their slicing levels positioned: at h1+h2, h1−h2, −h1+h2, and −h1−h2. In contrast, the error slicers may have their slicing levels positioned at 0, $2*h_2$ and $2*h_1$.

The block diagram 200 also includes equalization and adaptation logic 240, which may include a decision feedback equalization (DFE) engine 243. In addition, the equalization and adaptation logic 240 may also include a digital filter 245 and the digital filter may include a phase detector for determining the phase associated with the received error signal. The clock data recovery of the CDRS 110 may be adjusted such that the signal traces cross 0 and $2h_2$. After passing through the phase detector 247, the phase error gets sent to the accumulators.

Figure 3B:
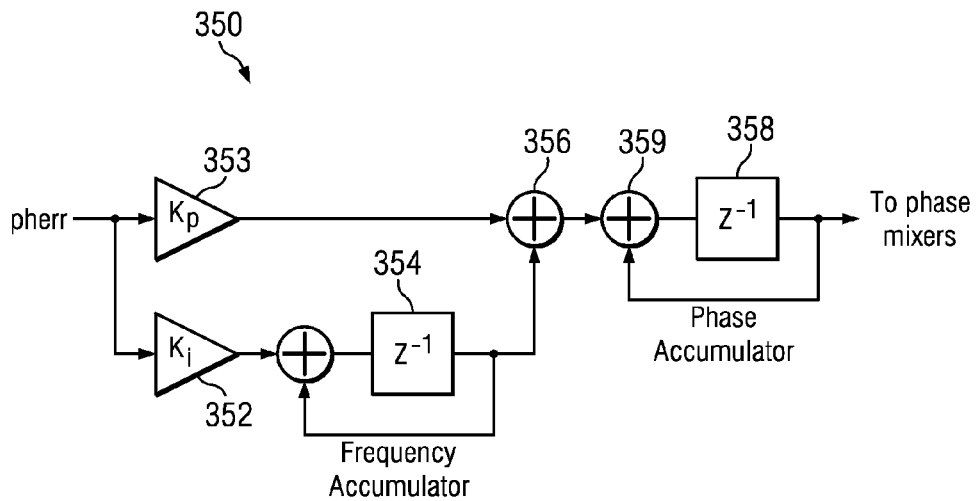
FIG. 3B is a block diagram 300 of accumulation logic within the digital filter of FIG. 2.

FIG. 3B is a block diagram 300 of accumulation logic 249 within the digital filter 245. In the diagram 350, the phase of the selected error sample may be split along two paths with different gains. For example, gain block 352 may have a first gain such that the delayed phase signal is added with the output of a frequency accumulator 354. In contrast, the inverter 353 may have a different gain, such that the gain signal emerging from it gets summed with the output of the frequency accumulator in the adder 356. This may then be summed with feedback from the phase accumulator 358 using adder 359. Returning to FIG. 2, the output of the digital filter 245 may be sent to the phase mixer 250. This phase mixer converts a received phase signal associated with the selected error sample to a delay signal.

Figure 4:
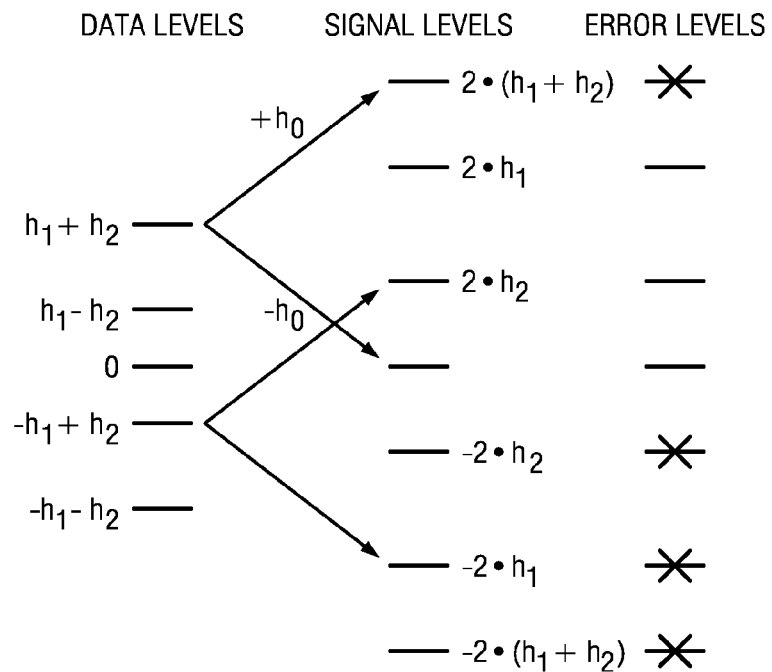
FIG. 4 is a reduction of comparator levels.

FIG. 4 is a diagram 400 illustrating a reduction of comparator levels resulting from using the CDRS 110. As mentioned with reference to FIG. 2, one implementation of the CDRS 110 may use four clocked-comparators, or slicers, which would have four different data levels as illustrated by data levels 410. Because the signals are digital signals, this may translate into numerous signals levels, such as signal level $2*(h_1+h_2)$ and $-2*(h1+h2)$. However, locking the phase at $h_0 = h_1 + h_2$ causes some overlap in the signal levels 420. This means that now a single clocked-comparator can detect more than one signal level, which increases efficiency.

Figure 5:
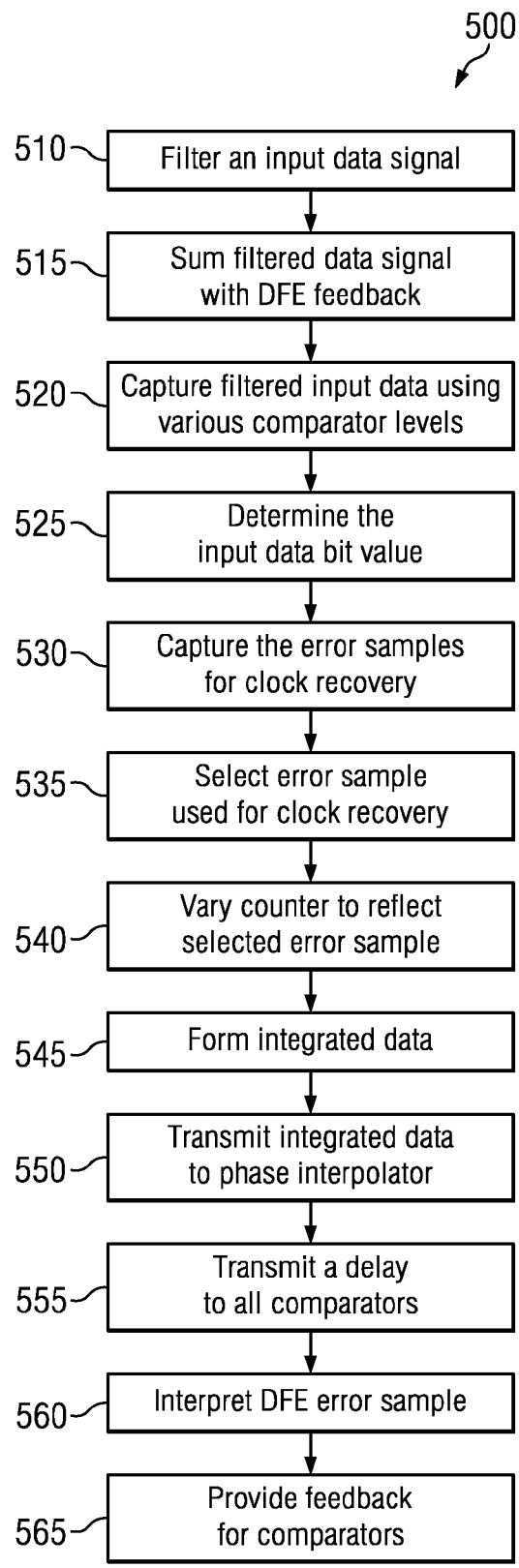
FIG. 5 is a flow chart for the clock data recovery system.

FIG. 5 is a flow chart 500 for a method of clock data recovery using the clock data recovery system 110. In block 510, an input data signal may be filtered. This filtering may be done with an active or passive high-pass filter. Block 510 is followed by block 515. In this block, the filtered data signal may be summed with a feedback signal, such as a DFE feedback signal. Block 515 is followed by block 520, where the filtered input data signal is captured using various comparator levels. Block 520 is followed by block 525, which determines the input data bit value. This determination may be made by data comparators in conjunction with a multiplexer, such as a four to one multiplexer. Block 525 is followed by block 530, which captures the error signal for clock recovery. Clocked comparators, such as the one illustrated in FIG. 3A may facilitate this capture.

Block 530 is followed by block 535, which selects an error sample that is used for clock recovery. The error sample selected will depend on the data history bits. A counter may be varied to reflect the selected error sample, as shown in block 540. Block 540 may be followed by block 545, which is where the integrated data may be formed. In block 550, integrated data may be transmitted to a phase interpolator. In response, a delay may be transmitted to all the comparators in block 555. Block 555 is followed by block 560. In that block, the DFE error sample may be interpreted. Finally, block 560 is followed by block 565. In this block, feed back may be provided for the comparators, which facilitates the clock data recovery. Though each of the blocks in these figures are numbered sequentially, this represents one of many possible implementations for this method. Numerous alternative implementations for designing the clock data recover system may result from reordering one or more of these blocks or for performing any of these blocks in parallel.

Figure 6:
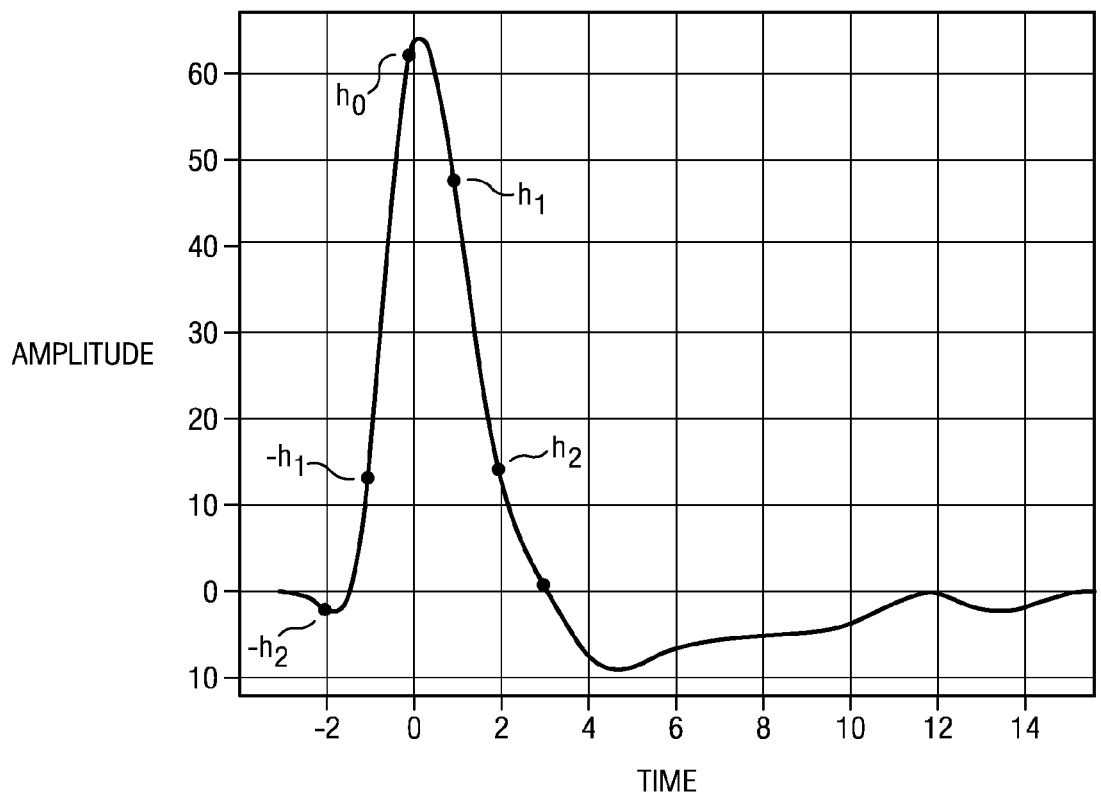
FIG. 6 is a plot of a single bit response (SBR) for a CDR mode where the CDR converges to the phase at which $h_0 = h_1 + h_2$.

FIG. 6 is a plot of a single bit response (SBR) for a CDR mode where the CDR converges to the phase at which $h_0=h_1+h_2$. The data samples are marked $-h_2, -h_1, h_0, h_1,$ and $h_2$. The main cursor is delayed relative to the $h_0=h_1$ lock point. This delay helps to mitigate the effects of jitter and off-center sampling in low-loss channels.

While various embodiments of the clock data recover system have been described, it may be apparent to those of ordinary skill in the art that many more embodiments and implementations are possible that are within the scope of this system. Although certain aspects of the clock data recover systems may be described in relation to specific techniques or structures, the teachings and principles of the present system are not limited solely to such examples. All such modifications are intended to be included within the scope of this disclosure and the present clock data recovery system and protected by the following claim(s).

The invention claimed is:

1. A clock data recovery system, comprising:
   a high pass filter for transmitting a filtered data signal in response to receiving an input data signal;
   an adder for summing the filtered data signal with a feedback signal, wherein the adder produces a summed input signal;
   a plurality of clocked data comparators for receiving the summed input signal, wherein the clocked data comparators determine an input data bit value;
   a plurality of clocked error comparators for receiving the summed input signal associated with clock recovery and generating at least one error sample of the summed input signal;
   an equalization and adaptation logic for determining a phase associated with the error sample; and
   a phase mixer for transmitting a delay in response to receiving the phase and the delay is transmitted to the clocked-data comparators and the clocked error comparators, wherein the feedback signal is generated by the equalization and adaptation logic.

2. The clocked data recovery system of claim 1 wherein the equalization and adaptation engine further comprises a phase detector and accumulation logic.

3. The clocked data recover system of claim 1, wherein the clock recovery is a two-tap, partial response equalization with baud rate clock recovery.

4. The clocked data recover system of claim 1, wherein the clock recovery is a one-tap, partial response equalization with baud rate clock recovery.

5. The clocked data recover system of claim 1, wherein the clock recovery is a full equalization with baud rate clock recovery.

\* \* \* \* \*